United States Patent
Yang

(10) Patent No.: US 10,141,612 B2
(45) Date of Patent: Nov. 27, 2018

(54) RECHARGEABLE BATTERY WITH CONTROL CIRCUIT

(71) Applicant: Huawei Technologies Co., Ltd., Shenzhen (CN)

(72) Inventor: Tongyong Yang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 326 days.

(21) Appl. No.: 15/154,374

(22) Filed: May 13, 2016

(65) Prior Publication Data

US 2016/0254575 A1 Sep. 1, 2016

Related U.S. Application Data

(63) Continuation of application No. PCT/CN2014/087050, filed on Sep. 22, 2014.

(30) Foreign Application Priority Data

Dec. 25, 2013 (CN) .......................... 2013 1 0726700

(51) Int. Cl.
*H01M 10/46* (2006.01)
*H01M 10/42* (2006.01)
(Continued)

(52) U.S. Cl.
CPC ........ *H01M 10/465* (2013.01); *H01L 51/442* (2013.01); *H01M 10/42* (2013.01);
(Continued)

(58) Field of Classification Search
CPC ............. H02J 7/355; H02J 7/0042; H02J 7/35
(Continued)

(56) References Cited

U.S. PATENT DOCUMENTS 4,882,239 A 11/1989 Grimmer et al.
6,380,710 B1 4/2002 Watanabe et al.
(Continued)

FOREIGN PATENT DOCUMENTS

CN 2699490 Y 5/2005
CN 201004465 Y 1/2008
(Continued)

OTHER PUBLICATIONS

Partial English Translation and Abstract of Chinese Patent Application No. CN101924184, May 27, 2016, 8 pages.
(Continued)

*Primary Examiner* — Edward Tso
(74) *Attorney, Agent, or Firm* — Conley Rose, P.C.

(57) ABSTRACT

A battery apparatus including a battery structure and a control circuit, where the battery structure is in a filamentous shape, and the battery structure includes an energy storage unit disposed inside the battery structure and an electricity generator disposed around the energy storage unit, where the electricity generator is a solar battery, and the control circuit is configured to control whether the energy storage unit is electrically connected to the electricity generator in order to control whether electric energy generated by the electricity generator is transferred to and stored in the energy storage unit. The battery apparatus may not only generate electric energy, but also store the electric energy, and supply electricity to an electronic device conveniently.

20 Claims, 6 Drawing Sheets

(51) Int. Cl.
  *H01M 14/00* (2006.01)
  *H01L 51/44* (2006.01)
  *H02J 7/35* (2006.01)
  *H01M 10/058* (2010.01)
  *H01M 4/38* (2006.01)
  *H01M 4/485* (2010.01)
  *H01M 4/58* (2010.01)
  *H01M 4/587* (2010.01)
  *H01M 4/60* (2006.01)
  *H01M 10/0525* (2010.01)
  *H01L 51/00* (2006.01)
  *H01L 51/42* (2006.01)

(52) U.S. Cl.
  CPC ......... *H01M 10/425* (2013.01); *H01M 14/00* (2013.01); *H02J 7/355* (2013.01); *H01L 51/0037* (2013.01); *H01L 51/4253* (2013.01); *H01M 4/386* (2013.01); *H01M 4/387* (2013.01); *H01M 4/485* (2013.01); *H01M 4/587* (2013.01); *H01M 4/5825* (2013.01); *H01M 4/60* (2013.01); *H01M 10/058* (2013.01); *H01M 10/0525* (2013.01); *H01M 2010/4271* (2013.01); *Y02E 60/122* (2013.01)

(58) Field of Classification Search
  USPC ......... 320/101, 107, 112; 136/245, 251, 256
  See application file for complete search history.

(56) References Cited

U.S. PATENT DOCUMENTS

| | | |
|---|---|---|
| 2007/0107771 A1 | 5/2007 | Tempesta |
| 2010/0033125 A1 | 2/2010 | Yamada |
| 2010/0037949 A1 | 2/2010 | Zou |
| 2010/0277115 A1 | 11/2010 | Lai |
| 2014/0373920 A1 | 12/2014 | Bugsy |

FOREIGN PATENT DOCUMENTS

| | | |
|---|---|---|
| CN | 101266885 A | 9/2008 |
| CN | 100505325 C | 6/2009 |
| CN | 101535923 A | 9/2009 |
| CN | 101877494 A | 11/2010 |
| CN | 101924184 A | 12/2010 |
| CN | 102347147 A | 2/2012 |
| CN | 103138024 A | 6/2013 |
| EP | 0332004 A2 | 2/1989 |

OTHER PUBLICATIONS

Partial English Translation and Abstract of Chinese Patent Application No. CN103138024, May 27, 2016, 3 pages.
Kwon, Y., et al., "Cable-Type Flexible Lithium Ion Battery Based on Hollow Multi-Helix Electrodes," Material Views, Advanced Materials, Oct. 2, 2012, 6 pages.
Foreign Communication From a Counterpart Application, Chinese Application No. 201310726700.4, Chinese Office Action dated Jul. 18, 2016, 3 pages.
Foreign Communication From a Counterpart Application, Chinese Application No. 201310726700.4, Chinese Search Report dated Jul. 7, 2016, 2 pages.
Foreign Communication From a Counterpart Application, PCT Application No. PCT/CN2014/087050, English Translation of International Search Report dated Dec. 24, 2014, 3 pages.
Foreign Communication From a Counterpart Application, PCT Application No. PCT/CN2014/087050, English Translation of Written Opinion dated Dec. 24, 2014, 14 pages.

RECHARGEABLE BATTERY WITH CONTROL CIRCUIT

CROSS-REFERENCE TO RELATED APPLICATIONS

This application is a continuation of International Application No. PCT/CN2014/087050, filed on Sep. 22, 2014, which claims priority to Chinese Patent Application No. 201310726700.4, filed on Dec. 25, 2013, both of which are hereby incorporated by reference in their entireties.

TECHNICAL FIELD

The present application relates to the field of energy, and in particular, to a battery apparatus and an electronic device including the battery apparatus.

BACKGROUND

Technical innovation, lightening and thinning, and functionalization of mobile terminals and portable electronic products impose a higher requirement for energy density of batteries. However, an increase speed of the energy density of the batteries seriously lags behind needs for the energy density of the batteries and a gap between supply and demand of energy is increasingly widened. This is macroscopically manifested by a short service time of electronic products, which seriously restricts performance of the electronic products and results in poor experience of consumers. A solar battery technology that converts natural light energy into electric energy is a possible method for resolving insufficiency of energy supply. A solar battery generates electricity under a lighting condition, which can not only directly provide electric energy to an electronic product, but also charge a battery equipped in the electronic product in order to prolong a service time of the electronic product.

From a perspective of appearance, a solar battery may be in a tablet, flexible thin-film, or filamentous form. A tablet solar battery is mainly applicable to a centralized or distributed large-scale electricity generation scenario, a flexible thin-film solar battery is applicable to electricity supply for integrated buildings, flexible electronic devices, and wearable electronic devices (such as intelligent watches and glasses), and a filamentous solar battery has a small volume and can be bent into any shape, and therefore is more suitable for integration with an electricity-using product and is highly portable. In addition, the filamentous solar battery may be woven into cloth for making clothes or flexible thin-film batteries in order to be applied to fields to which a thin-film battery and a tablet battery are applicable. In comparison, the filamentous solar battery has wider application scenarios, and is an ideal form of the solar battery.

The solar battery is an electric energy generation apparatus. Carriers generated by a photoelectric active material inside the solar battery are separately conducted through two electrodes to form a current using an external circuit in order to complete an electricity generation process. Therefore, at present, during an application, the solar battery needs to be externally connected to an energy storage apparatus (such as a lithium-ion battery and a lead-acid battery) for storing electric energy. This is true with, for example, current centralized electricity generation from solar energy and charging a mobile phone using a solar earphone. In order to implement a concept of supplementing electric energy using light energy, two components a solar battery and an energy storage battery are needed, which results in two deficiencies.

Firstly, the solar battery cannot be applied independently. If there is no energy storage device, the solar battery cannot implement electricity generation even if there is strong light irradiation, thereby wasting resources. Secondly, the solar battery and the energy storage battery need to be connected using an external wire. Therefore, for mobile application scenarios such as intelligent terminals and portable electronic products, a solar battery device and an electronic product need to be connected all the time using a wire, which brings lots of inconvenience to daily life of consumers.

SUMMARY

A technical problem to be resolved in embodiments of the present disclosure lies in providing a battery apparatus and an electronic device including the battery apparatus. The battery apparatus can not only generate electric energy, but also store the electric energy such that the battery apparatus can work independently, can supply electricity to an electronic device conveniently, and can generate electric energy, thereby prolonging a service time of the electronic device.

To achieve the foregoing objective, implementation manners of the present disclosure provide the following technical solutions.

According to a first aspect, a battery apparatus is provided.

The battery apparatus includes a battery structure and a control circuit, where the battery structure is in a filamentous shape, and the battery structure includes an energy storage unit disposed inside the battery structure and an electricity generation unit disposed around the energy storage unit, where the electricity generation unit is a solar battery, and the control circuit is configured to control whether the energy storage unit is electrically connected to the electricity generation unit in order to control whether electric energy generated by the electricity generation unit is transferred to and stored in the energy storage unit.

In a first possible implementation manner, both the electricity generation unit and the energy storage unit are disposed along an extension direction of an axis of the battery structure, a cross-section, perpendicular to the axis of the battery structure, of the energy storage unit is a circle, a cross-section, perpendicular to the axis of the battery structure, of the electricity generation unit is a ring, and the electricity generation unit is disposed around the energy storage unit.

In a second possible implementation manner, the energy storage unit is a lithium-ion battery, and the energy storage unit includes a first negative electrode, a separation film, an electrolyte, and a first positive electrode that are disposed in sequence from inside to outside, where the first negative electrode includes a negative electrode current collector and a negative electrode active material layer, and the first positive electrode includes a positive electrode current collector and a positive electrode active material layer.

With reference to the second possible implementation manner, in a third possible implementation manner, the negative electrode current collector is made of a copper wire, a diameter of the negative electrode current collector is 0.05 millimeters to 0.2 millimeters, and the positive electrode current collector is made of an aluminum wire whose diameter is 0.05 millimeters to 0.2 millimeters.

With reference to the second possible implementation manner, in a fourth possible implementation manner, the separation film surrounds the first negative electrode, the first positive electrode surrounds the separation film, and the electrolyte is padded between the first positive electrode and the first negative electrode.

With reference to the fourth possible implementation manner, in a fifth possible implementation manner, a cross-section, perpendicular to an extension direction of the battery structure, of the energy storage unit is a circle, a cross-section, perpendicular to the extension direction of the battery structure, of the first negative electrode is a circle, and cross-sections, perpendicular to the extension direction of the battery structure, of the separation film and the first positive electrode are rings.

With reference to the second possible implementation manner, in a sixth possible implementation manner, the separation film surrounds the first positive electrode, the first negative electrode surrounds the separation film, and the electrolyte is padded between the first positive electrode and the first negative electrode.

With reference to the sixth possible implementation manner, in a seventh possible implementation manner, a cross-section, perpendicular to an extension direction of the battery structure, of the energy storage unit is a circle, a cross-section, perpendicular to the extension direction of the battery structure, of the first positive electrode is a circle, and cross-sections, perpendicular to the extension direction of the battery structure, of the separation film and the first negative electrode are rings.

With reference to the second possible implementation manner, in an eighth possible implementation manner, the negative electrode active material layer includes a negative electrode active material, and the negative electrode active material is lithium titanate, graphite, silicon, tin, or a tin alloy, and the positive electrode active material layer includes a positive electrode active material, and the positive electrode active material is a lithium transition-metal oxide, a lithium phosphate, or an organic compound.

In a ninth possible implementation manner, the electricity generation unit is a polymer solar battery, and the electricity generation unit includes a second negative electrode, a polymer active material layer, and a second positive electrode in sequence from inside to outside, where the second positive electrode includes an electrode modification layer and a transparent electrode, and the transparent electrode is a polyethylene terephthalate film coated with an indium-tin oxide conductive layer.

In a tenth possible implementation manner, the electricity generation unit is a polymer solar battery, and the electricity generation unit includes a second positive electrode, a polymer active material layer, and a second negative electrode in sequence from inside to outside, where the second negative electrode includes an electrode modification layer and a transparent electrode, and the transparent electrode is a polyethylene terephthalate film coated with an indium-tin oxide conductive layer.

With reference to the ninth possible implementation manner, in an eleventh possible implementation manner, the polymer active material layer includes a donor material and a receptor material, where the donor material is a polymer containing thiophene, a polymer containing benzodithiophene, or a polymer containing thienothiophene, and the receptor material is a fullerene derivative.

With reference to the ninth possible implementation manner, in a twelfth possible implementation manner, the electricity generation unit includes multiple solar battery monomers, the electrode modification layer, the polymer active material layer, and the second negative electrode are split into multiple blocks along an extension direction of the battery structure, where each block correspondingly forms one solar battery monomer, and the solar battery monomers are connected in series using the indium-tin oxide conductive layer of the transparent electrode.

With reference to the tenth possible implementation manner, in a thirteenth possible implementation manner, the electricity generation unit includes multiple solar battery monomers, the electrode modification layer, the polymer active material layer, and the second positive electrode are split into multiple blocks along an extension direction of the battery structure, where each block correspondingly forms one solar battery monomer, and the solar battery monomers are connected in series using the indium-tin oxide conductive layer of the transparent electrode.

In a fourteenth possible implementation manner, a cross-section, perpendicular to an extension direction of the battery structure, of the battery structure is a circle, a triangle, or a polygon.

In a fifteenth possible implementation manner, a cross-section, perpendicular to an extension direction of the battery structure, of the battery structure is a circle, and a diameter of the cross-section is 0.3 millimeters to 0.8 millimeters.

According to a second aspect, an electronic device is provided.

The electronic device includes an electronic device body and the battery apparatus provided according to the first aspect or any one of the possible implementation manners of the first aspect, where the electronic device body is electrically connected to a control circuit of the battery apparatus, and the control circuit is further configured to control the battery apparatus to supply electricity to the electronic device body.

The battery apparatus provided in the present technical solutions includes a battery structure. The battery structure is roughly in a filamentous shape and is of good flexibility. Moreover, the battery structure includes an energy storage unit and an electricity generation unit that are concentrically disposed. The electricity generation unit is a solar battery. In this way, electric energy generated by the electricity generation unit can be conveniently stored into the energy storage unit. Therefore, a problem in the prior art that resources are wasted because a solar battery cannot work without an electricity-using device connected can be resolved. In addition, the filamentous battery structure is highly integrated. Therefore, the battery apparatus can be widely applied to various types of flexible electronic devices and the like.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

Figure 1:
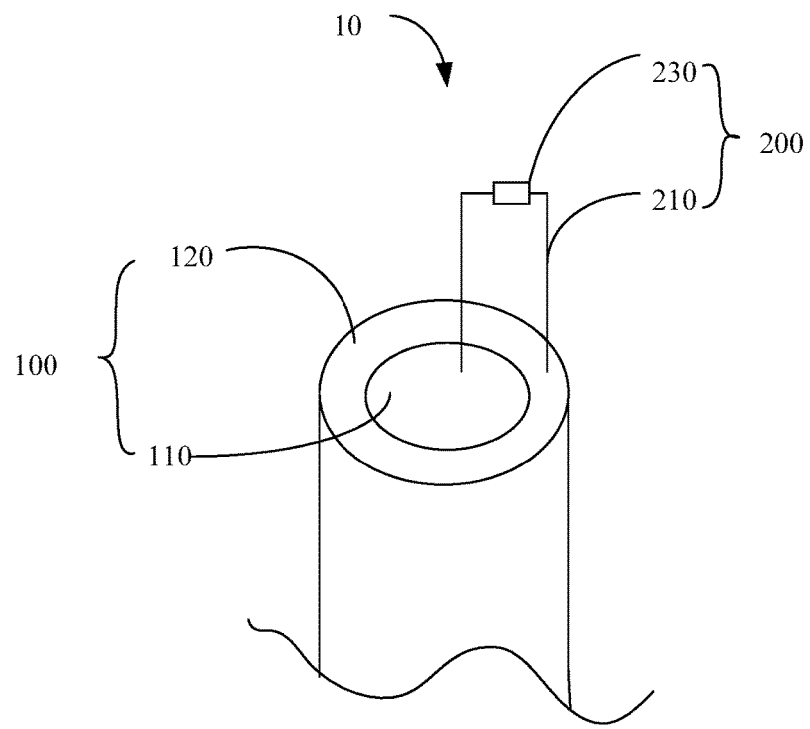
FIG. 1 is a schematic diagram of a battery apparatus according to a first exemplary implementation manner of the present disclosure.
Figure 2:
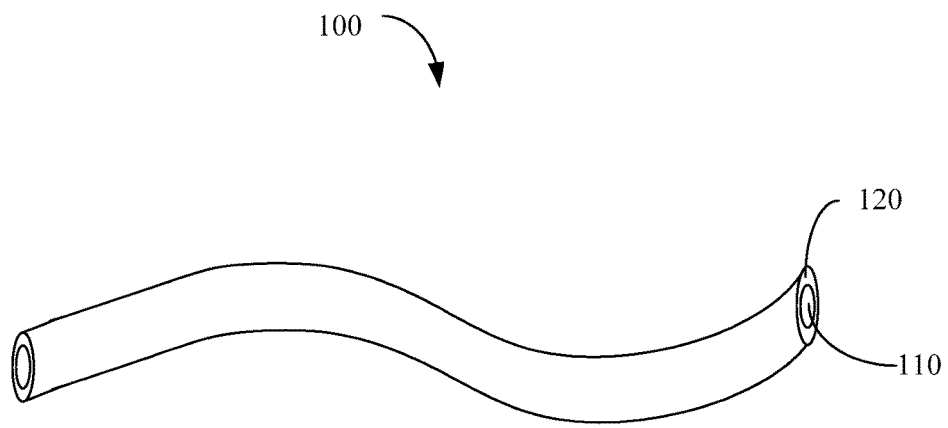
FIG. 2 is a schematic three-dimensional diagram of a battery structure in FIG. 1.
Figure 3:
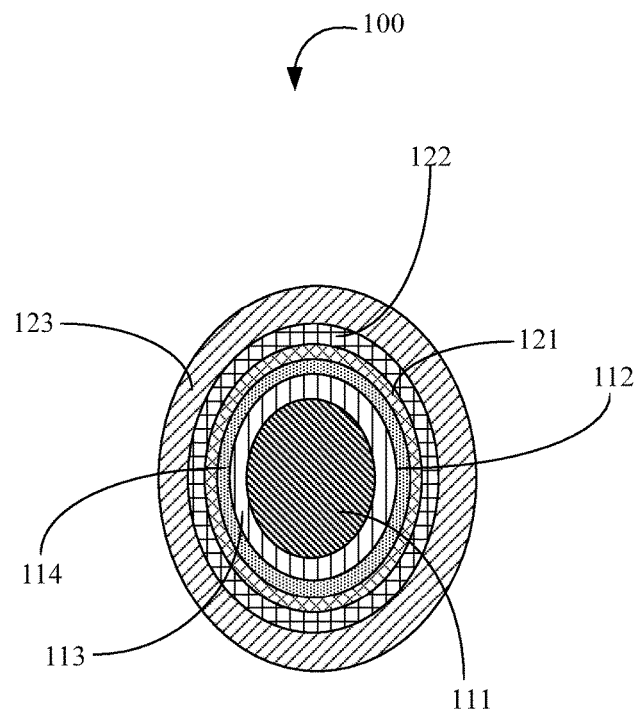
FIG. 3 is a schematic cross-sectional diagram of a battery structure in FIG. 2.

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Referring to FIG. 1, FIG. 2, FIG. 3, and FIG. 4, a first technical solution of the present disclosure provides a battery apparatus. A first exemplary implementation manner of the first technical solution of the present disclosure provides a battery apparatus 10, the battery apparatus 10 includes a battery structure 100 and a control circuit 200.

The battery structure 100 includes an energy storage unit 110 and an electricity generation unit 120. The electricity generation unit 120 and the energy storage unit 110 are concentrically disposed, and the electricity generation unit 120 surrounds the energy storage unit 110. The battery structure 100 is in a filamentous shape, is flexible, and can be bent in any way. A cross-section of the battery structure 100 may be in any shape that needs to be set, for example, a circle, a triangle, a polygon, or an oval. In this implementation manner, a shape of a cross-section, perpendicular to an extension direction, of the battery structure 100 is a circle. A diameter of the cross-section is 0.3 millimeters to 0.8 millimeters, and is preferably about 0.5 millimeters. Both the electricity generation unit 120 and the energy storage unit 110 are disposed along an extension direction of an axis of the battery structure 100. A cross-section, perpendicular to the axis of the battery structure 100, of the energy storage unit 110 is a circle, a cross-section, perpendicular to the axis of the battery structure 100, of the electricity generation unit 120 is a ring, and the electricity generation unit 120 is disposed around the energy storage unit 110. The energy storage unit 110 may be a rechargeable battery that can store energy, such as a lithium-ion battery, a nickel metal hydride battery, or a lead-acid battery. In this implementation manner, a description is made using an example that the energy storage unit 110 is a lithium-ion battery. The energy storage unit 110 includes a first negative electrode 111, a separation film 112, an electrolyte 113, and a first positive electrode 114 in sequence from inside to outside. The first negative electrode 111 may include a negative electrode current collector and a negative electrode active material layer. The negative electrode current collector may be a metal wire of good electroconductivity, for example, a copper wire. A diameter of the negative electrode current collector is 0.05 millimeters to 0.2 millimeters, and is preferably 0.1 millimeters. A negative electrode active material may be lithium titanate, graphite, silicon, tin, a tin alloy, or the like. In this implementation manner, the negative electrode active material layer consists of a negative electrode active material and a bonding agent. The negative electrode active material is graphite powder. The bonding agent may be carboxyl methyl cellulose (CMC) and bonding agent styrene butadiene rubber (SBR) latex. A mass ratio of the graphite powder, the CMC, and the bonding agent SBR latex is 95:2.5:2.5. A cross-section, perpendicular to the extension direction of the battery structure 100, of the energy storage unit 110 is a circle, a cross-section, perpendicular to the extension direction of the battery structure 100, of the first negative electrode 111 is a circle, and cross-sections, perpendicular to the extension direction of the battery structure 100, of the separation film 112 and the first positive electrode 114 are rings.

The separation film 112 is wound and wrapped around an outer surface of the first negative electrode 111, and is configured to separate the first negative electrode 111 from the first positive electrode 114. The separation film 112 may be a microporous film made of polyethylene or polypropylene, or may be a porous film made of another material that can be applied to a lithium-ion battery separation film, for example, polyvinylidene fluoride.

The first positive electrode 114 is disposed around the separation film 112. The first positive electrode 114 includes a positive electrode current collector and a positive electrode active material layer. The positive electrode current collector is a conductive metal wire, such as an aluminum wire, that is wound around a surface of the separation film 112 and whose diameter is 0.05 millimeters to 0.2 millimeters. A positive electrode active material may be a lithium transition-metal oxide, a lithium phosphate, or an organic compound, and may be lithium cobaltate, lithium manganate, nickel cobalt lithium manganate, lithium titanate, lithium iron phosphate, lithium vanadium phosphate, lithium cobalt phosphate, lithium nickel phosphate, dithio oxamide, tetrathiafulvalene, ringed 1,2-dione, or the like. In this implementation manner, the positive electrode active material layer is made of a positive electrode active material, a conductive agent, and a bonding agent. The positive electrode active material is lithium cobaltate, the conductive agent may be carbon black powder, and the bonding agent may be 1-chloro-1-fluoroethylene. A mass ratio of the lithium cobaltate, the carbon black powder, and the 1-chloro-1-fluoroethylene is 96:2:2. N-Methylpyrrolidone is used to evenly mix the lithium cobaltate, the carbon black powder, and the 1-chloro-1-fluoroethylene to form an oiliness slurry on a surface of the positive electrode current collector, and then the oiliness slurry is baked to form the positive electrode active material layer.

The electrolyte 113 is padded between the first positive electrode 114 and the first negative electrode 111, and is used as a carrier of an ion flowing between the first positive electrode 114 and the first negative electrode 111. The electrolyte 113 may be a liquid electrolyte, or may be a solid polymer electrolyte. The liquid electrolyte may include a solvent and a conductive salt. The solvent may be an anhydrous organic compound such as ethyl carbonate or propylene carbonate, and the conductive salt may be lithium hexafluorophosphate or the like. The solid polymer electrolyte may be a dry solid polymer electrolyte (SPE) or a gel polymer electrolyte (GPE).

In this implementation manner, a negative electrode capacity of the energy storage unit 110 is about 1.05 times a positive electrode capacity, and the energy storage unit 110 has a length of about 30 centimeters. The energy storage unit 110 may store electricity of about 30 milliampere hour (mAh).

The electricity generation unit 120 surrounds the energy storage unit 110. The electricity generation unit 120 may be a polymer solar battery. When a voltage generated by the electricity generation unit 120 can meet a voltage requirement of the energy storage unit 110, the electricity generation unit 120 is a polymer solar battery monomer. The electricity generation unit 120 includes a second negative electrode 121, a polymer active material layer 122, and a second positive electrode 123 in sequence from inside to outside. The second negative electrode 121 surrounds the first positive electrode 114. The second negative electrode 121 is made of metal, where the metal may be silver, aluminum, copper, or the like. The polymer active material layer 122 includes a donor material and a receptor material. The donor material is an electronic donor material, and includes a polymer containing thiophene, a polymer containing benzodithiophene (BDT), or a polymer containing thienothiophene. An exemplary scheme is poly(3-hexylthiophene) (P3HT). The receptor material is an electronic receptor material, and includes a fullerene derivative. An exemplary scheme is [6,6]-phenyl-C61-butyric acid methyl ester (PCBM). A thickness of the polymer active material layer 122 is about 0.09 microns to 0.2 microns. The second positive electrode 123 includes an electrode modification layer and a transparent electrode. In this implementation manner, the electrode modification layer is made of PEDOT:PSS. The PEDOT:PSS consists of two substances: PEDOT and PSS. The PEDOT is poly(3,4-ethylenedioxythiophene), and the PSS is a polystyrene sulfonic acid salt. The transparent electrode is a polyethylene terephthalate film coated with an indium-tin oxide conductive layer.

Figure 4:
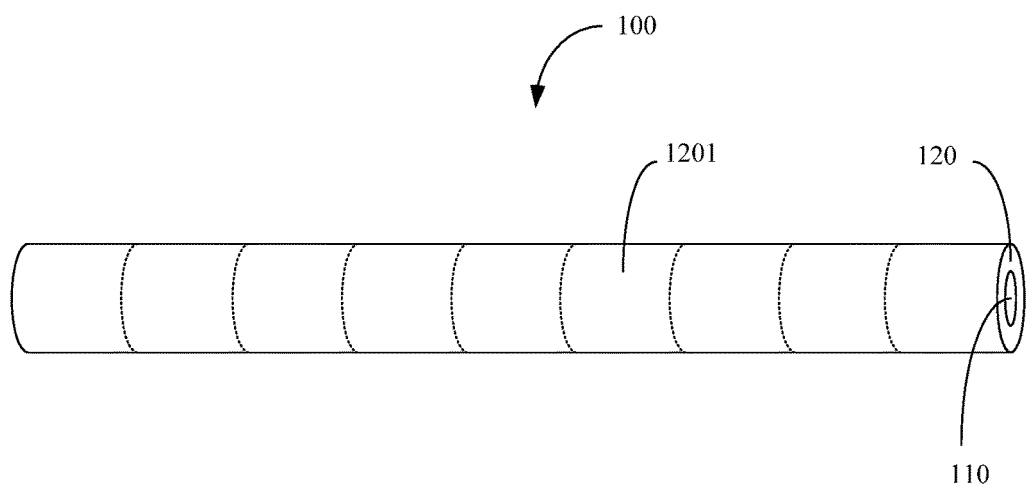
FIG. 4 is a schematic diagram of the battery structure in FIG. 1 that includes multiple solar battery monomers.

Referring to FIG. 4, when a voltage generated by one polymer solar battery monomer cannot meet the voltage requirement of the energy storage unit 110, in order that the voltage generated by the electricity generation unit 120 can reach a voltage of the energy storage unit 110, the electricity generation unit 120 may include multiple polymer solar battery monomers 1201 that are connected in series. Furthermore, each polymer solar battery monomer 1201 has an independent second negative electrode 121, a polymer active material layer 122, and an electrode modification layer. Transparent electrodes of the polymer solar battery monomers are mutually connected to form an entirety such that the polymer solar battery monomers 1201 are connected in series using the transparent electrodes, and the voltage generated by the electricity generation unit 120 during electricity generation can meet the requirement of the energy storage unit 110.

In this implementation manner, nine polymer solar battery monomers are disposed in the energy storage unit 110 having a length of about 30 centimeters. The nine polymer solar battery monomers are connected in series using the transparent electrodes as a connection path, to form the electricity generation unit 120.

It may be understood that the electricity generation unit 120 may also be another type of flexible thin-film solar battery, for example, an amorphous silicon flexible battery or a copper indium gallium selenium thin-film battery.

The control circuit 200 includes a conductive line 210 and a control component 230. The conductive line 210 is configured to connect the first positive electrode 114 of the energy storage unit 110 and the second positive electrode 123 of the electricity generation unit 120, and is configured to connect the first negative electrode 111 of the energy storage unit 110 and the second negative electrode 121 of the electricity generation unit 120. The control component 230 is connected to the conductive line 210. The control component 230 is configured to control whether the battery structure 100 works and its working status.

Furthermore, the control component 230 may control the conductive line 210 to be in a connected state all the time such that electric energy generated by the electricity generation unit 120 is stored into the energy storage unit 110. The control component 230 may also control the conductive line 210 to be in a disconnected state such that an electric connection between the electricity generation unit 120 and the energy storage unit 110 is interrupted, and therefore the electric energy generated by the electricity generation unit 120 cannot be stored into the energy storage unit 110.

The control component 230 may further control a status of electricity supply of the battery structure 100 to an electricity-using device according to different actual electricity consumption states. The control component 230 may control that the electric energy generated by the electricity generation unit 120 is directly supplied to the electricity-using device or the electric energy generated by the electricity generation unit 120 is stored into the energy storage unit, may control that the electric energy stored in the energy storage unit 110 is supplied to the electricity-using device, or may control the energy storage unit 110 and the electricity generation unit 120 to supply electricity to the electricity-using device at the same time.

The control component 230 may include a detection module, a control module, a switch unit, and an inspection module. The detection module is configured to detect how much electric energy is stored in the energy storage unit 110. When no electricity-using device is connected or a connected electricity-using device is not working, and when the detection module detects that the electric energy stored into the energy storage unit 110 reaches maximum electric energy stored in the energy storage unit 110, the control module may control the switch unit to interrupt the electric connection between the electricity generation unit 120 and the energy storage unit 110 such that the electric energy generated by the electricity generation unit 120 is not stored into the energy storage unit 110. When the detection module detects that the electric energy stored in the energy storage unit 110 does not reach the maximum electric energy stored in the energy storage unit 110, the control module may control the switch unit to electrically connect the electricity generation unit 120 and the energy storage unit 110 such that the electric energy generated by the electricity generation unit 120 is stored into the energy storage unit 110.

When an electricity-using device is connected and when the detection module detects that electric energy is stored in the energy storage unit 110, the control module may control the switch unit to connect the energy storage unit 110 and the electricity-using device, or connect the electricity generation unit 120 and the electricity-using device, or connect the energy storage unit 110 and the electricity-using device, and connect the electricity generation unit 120 and the electricity-using device in order to supply electricity to the electricity-using device. When the detection module detects that no electric energy is stored in the energy storage unit 110, the control module may control the switch unit to connect the electricity generation unit 120 and the electricity-using device in order to supply electricity to the electricity-using device. The control module may further control the electricity generation unit 120 to connect to the energy storage unit 110, and store electric energy into the energy storage unit 110.

The monitor module is configured to inspect an electric quantity generated by the electricity generation unit 120, and monitor and stabilize the voltage output by the electricity generation unit 120 in order to avoid occurrence of an over-charge phenomenon because the electric energy generated by the electricity generation unit 120 is greater than the maximum electric energy stored in the energy storage unit 110.

The battery apparatus 10 provided in this technical solution includes a battery structure 100. The battery structure 100 is roughly in a filamentous shape and is of good flexibility. Moreover, the battery structure 100 includes an energy storage unit 110 and an electricity generation unit 120 that are concentrically disposed. The electricity generation unit 120 is a solar battery. In this way, electric energy generated by the electricity generation unit 120 can be conveniently stored into the energy storage unit 110. Therefore, a problem in the prior art that resources are wasted because a solar battery cannot work without an electricity-using device connected can be resolved. In addition, the filamentous battery structure 100 is highly integrated. Therefore, the battery apparatus 10 can be widely applied to various types of flexible electronic devices and the like.

Figure 5:
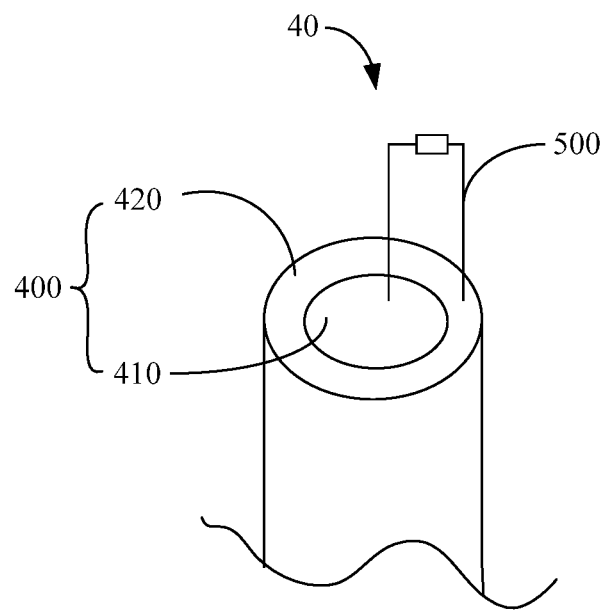
FIG. 5 is a schematic diagram of a battery apparatus according to a second exemplary implementation manner of the present disclosure.
Figure 6:
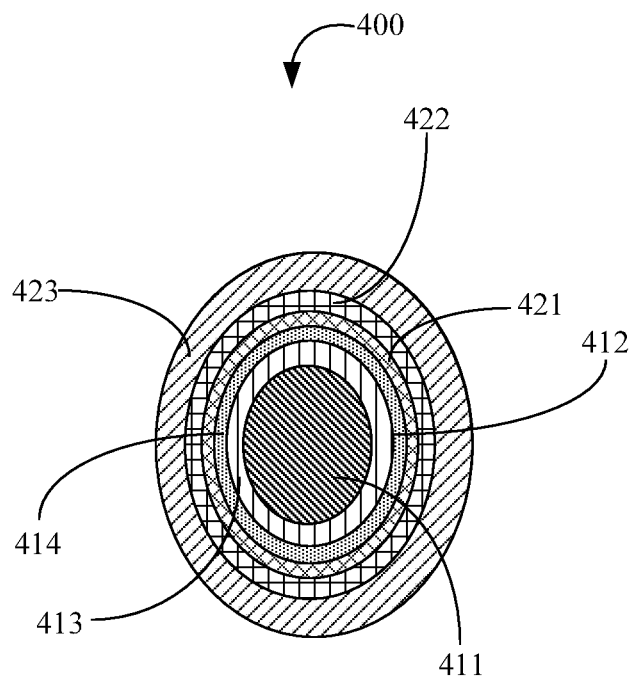
FIG. 6 is a schematic cross-sectional diagram of the battery structure in FIG. 5.

Referring to FIG. 5 and FIG. 6, a second exemplary implementation manner of the first technical solution of the present disclosure provides a battery apparatus 40, where battery apparatus 40 includes a battery structure 400 and a control circuit 500.

The battery structure 400 includes an energy storage unit 410 and an electricity generation unit 420. The electricity generation unit 420 and the energy storage unit 410 are concentrically disposed, and the electricity generation unit 420 surrounds the energy storage unit 410. The battery structure 400 is in a filamentous shape, is flexible, and can be bent in any way. A cross-section of the battery structure 400 may be in any shape that needs to be set, for example, a circle, a triangle, a polygon, or an oval. In this implementation manner, a shape of a cross-section, perpendicular to an extension direction of the battery structure 400, of the battery structure 400 is a circle. A diameter of the cross-section is 0.3 millimeters to 0.8 millimeters, and is preferably about 0.5 millimeters.

The energy storage unit 410 may be a rechargeable battery that can store energy, such as a lithium-ion battery, a nickel metal hydride battery, or a lead-acid battery. In this implementation manner, a description is made using an example that the energy storage unit 410 is a lithium-ion battery. The energy storage unit 410 includes a first positive electrode 411, a separation film 412, an electrolyte layer 413, and a first negative electrode 414 from inside to outside. The first positive electrode 411 may include a positive electrode current collector and a positive electrode active material layer. The positive electrode current collector may be a metal wire of good electroconductivity, for example, a copper wire. A diameter of the positive electrode current collector is 0.05 millimeters to 0.2 millimeters, and is preferably 0.1 millimeters. A positive electrode active material may be a lithium transition-metal oxide, a lithium phosphate, or an organic compound, and may be lithium cobaltate, lithium manganate, nickel cobalt lithium manganate, lithium titanate, lithium iron phosphate, lithium vanadium phosphate, lithium cobalt phosphate, lithium nickel phosphate, dithio oxamide, tetrathiafulvalene, ringed 1,2-dione, or the like. In this implementation manner, the positive electrode active material layer is made of a positive electrode active material, a conductive agent, and a bonding agent. The positive electrode active material is lithium cobaltate, the conductive agent may be carbon black powder, and the bonding agent may be 1-chloro-1-fluoroethylene. A mass ratio of the lithium cobaltate, the carbon black powder, and the 1-chloro-1-fluoroethylene is 96:2:2. N-Methylpyrrolidone is used to evenly mix the lithium cobaltate, the carbon black powder, and the 1-chloro-1-fluoroethylene to form an oiliness slurry on a surface of the positive electrode current collector, and then the oiliness slurry is baked to form the positive electrode active material layer. A cross-section, perpendicular to the extension direction of the battery structure 400, of the energy storage unit 410 is a circle, a cross-section, perpendicular to the extension direction of the battery structure 400, of the first positive electrode 411 is a circle, and cross-sections, perpendicular to the extension direction of the battery structure 400, of the separation film 412 and the first negative electrode 414 are rings.

The separation film 412 is wound and wrapped around an outer surface of the first positive electrode 411, and is configured to separate the first negative electrode 414 from the first positive electrode 411. The separation film 412 may be a microporous film made of polyethylene or polypropylene, or may be a porous film made of another material that can be applied to a lithium-ion battery separation film, such as polyvinylidene fluoride.

The first negative electrode 414 is disposed around the separation film 412. The first negative electrode 414 includes a negative electrode current collector and a negative electrode active material layer. The negative electrode current collector is a conductive metal wire, such as an aluminum wire, that is wound around a surface of the separation film 412 and whose diameter is 0.05 millimeters to 0.2 millimeters. A negative electrode active material may be lithium titanate, graphite, silicon, tin, a tin alloy, or the like. In this implementation manner, the negative electrode active material layer consists of a negative electrode active material and a bonding agent. The negative electrode active material is graphite powder. The bonding agent may be CMC and bonding agent SBR latex. A mass ratio of the graphite powder, the CMC, and the bonding agent SBR latex is 95:2.5:2.5.

The electrolyte 413 is padded between the first positive electrode 411 and the first negative electrode 414, and is used as a carrier of an ion flowing between the first positive electrode 411 and the first negative electrode 414. The electrolyte 413 may be a liquid electrolyte, or may be a solid polymer electrolyte. The liquid electrolyte may include a solvent and a conductive salt. The solvent may be an anhydrous organic compound such as ethyl carbonate or propylene carbonate, and the conductive salt may be lithium hexafluorophosphate or the like. The solid polymer electrolyte may be a dry SPE or a GPE.

In this implementation manner, a negative electrode capacity of the energy storage unit 410 is about 1.05 times a positive electrode capacity, and the energy storage unit 410 has a length of about 30 centimeters. The energy storage unit 410 may store electricity of about 30 mAh.

The electricity generation unit 420 surrounds the energy storage unit 410. The electricity generation unit 420 may be a polymer solar battery. When a voltage generated by the electricity generation unit 420 can meet a voltage requirement of the energy storage unit 410, the electricity generation unit 420 a polymer solar battery monomer. The electricity generation unit 420 includes a second positive electrode 421, a polymer active material layer 422, and a second negative electrode 423 in sequence from inside to outside. The second positive electrode 421 surrounds the first negative electrode 414. The second positive electrode 421 includes an electrode modification layer and a metal electrode. The metal electrode may be gold, silver, or the like. The electrode modification layer is a positive electrode modification layer, and may be a molybdenum oxide material. The polymer active material layer 422 may be P3HT and a soluble C60 derivative PCBM. A thickness of the polymer active material layer 422 is about 0.09 microns to 0.2 microns.

The second negative electrode 423 includes an electrode modification layer and a transparent electrode. In this implementation manner, the electrode modification layer is made of PFN. The PFN is a fluorene polymer modified by a quaternary ammonium salt. The transparent electrode is a polyethylene terephthalate film coated with an indium-tin oxide conductive layer.

When a voltage generated by one polymer solar battery monomer cannot meet the voltage requirement of the energy storage unit 410, in order that the voltage generated by the electricity generation unit 420 can reach a voltage of the energy storage unit 410, the electricity generation unit 420 may include multiple polymer solar battery monomers that are connected in series. Each polymer solar battery monomer has an independent second positive electrode 421, a polymer active material layer 422, and a second negative electrode 423. Transparent electrodes of the polymer solar battery monomers are mutually connected to form an entirety such that the polymer solar battery monomers are connected in series using the transparent electrodes, and the voltage generated by the electricity generation unit 420 during electricity generation can meet the requirement of the energy storage unit 410.

It may be understood that the electricity generation unit 420 may also be another type of flexible thin-film solar battery, for example, an amorphous silicon flexible battery or a copper indium gallium selenium thin-film battery.

A structure and function of the control circuit 500 may be the same as the structure and function of the control circuit 200 provided in the first implementation manner, and details are not described herein again.

A second technical solution of the present disclosure provides a method for making a battery apparatus, including steps of preparing an energy storage unit, forming an electricity generation unit around the energy storage unit in order to form a battery structure, where the electricity generation unit is a solar battery, and connecting a control circuit between the electricity generation unit and the energy storage unit.

Figure 7:
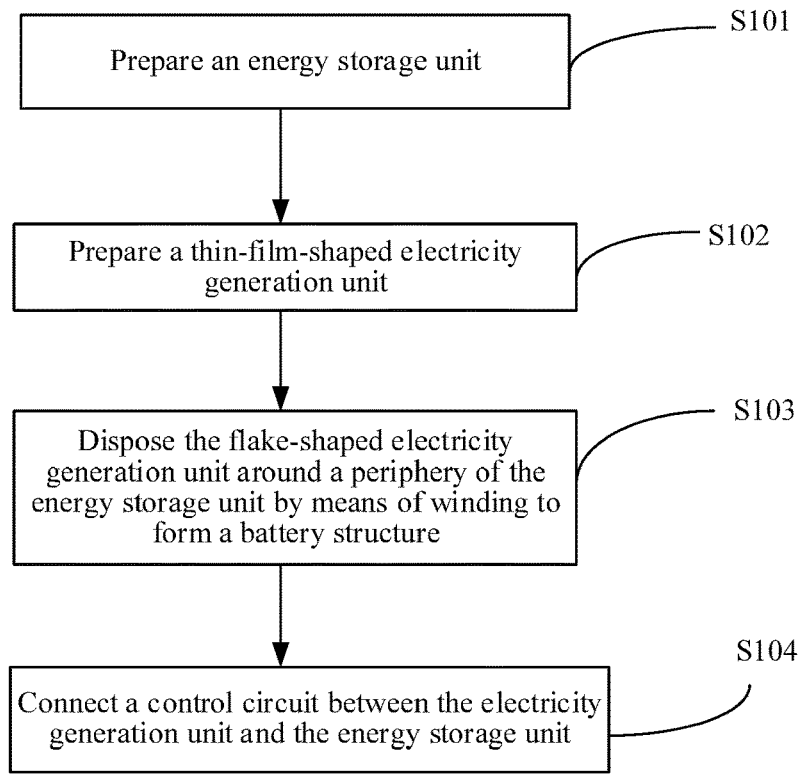
FIG. 7 is a flowchart of a first implementation manner of a method for making a battery apparatus according to the present disclosure.

Referring to FIG. 7, a first exemplary implementation manner of the second technical solution of the present disclosure provides a method for making a battery apparatus. A description is made using an example of making the battery apparatus 10. The method includes the following steps.

Step S101: Prepare an energy storage unit 110. In this implementation manner, the energy storage unit 110 is a lithium-ion battery. A specific making method may include the following steps.

Step 1: Prepare a positive electrode slurry and a negative electrode slurry. The negative electrode slurry may include a negative electrode active material, a bonding agent, a solvent, and the like. The negative electrode active material may be lithium titanate, graphite, silicon, tin, a tin alloy, or the like. The bonding agent may be CMC and bonding agent SBR latex. In this implementation manner, graphite powder, CMC, and bonding agent SBR latex are mixed according to a mass ratio of 95:2.5:2.5 and then added to deionized water to form the negative electrode slurry. The positive electrode slurry may include a positive electrode active material, a conductive agent, and a bonding agent. The positive electrode active material may be a lithium transition-metal oxide, a lithium phosphate, or an organic compound, and may be lithium cobaltate, lithium manganate, nickel cobalt lithium manganate, lithium titanate, lithium iron phosphate, lithium vanadium phosphate, lithium cobalt phosphate, lithium nickel phosphate, dithio oxamide, tetrathiafulvalene, ringed 1,2-dione, or the like. In this implementation manner, the positive electrode active material is lithium cobaltate, the conductive agent may be carbon black powder, and the bonding agent may be 1-chloro-1-fluoroethylene. After the lithium cobaltate, the carbon black powder, and the 1-chloro-1-fluoroethylene are mixed according to a mass ratio of 96:2:2, N-Methylpyrrolidone is added to form the oiliness positive electrode slurry.

Step 2: Prepare a first negative electrode 111. A copper wire whose diameter is about 0.1 millimeters is used as a negative electrode current collector. The negative electrode current collector is immersed into the negative electrode slurry. After that, the negative electrode current collector is taken out and then baked. The dried negative electrode slurry forms a negative electrode active material layer on a surface of the negative electrode current collector.

Step 3: Wrap a separation film 112 around the first negative electrode 111. The separation film 112 may be a microporous film made of polyethylene or polypropylene, or may be a porous film made of another material that can be applied to a lithium-ion battery separation film, such as polyvinylidene fluoride. The separation film 112 is wound and wrapped around an outer surface of the first negative electrode 111, and disposed concentrically with the first negative electrode 111.

Step 4: Form a first positive electrode 114 around the separation film 112. First, a positive electrode current collector is formed on the separation film 112. In this implementation manner, the positive electrode current collector is made of a metal aluminum wire, where the metal aluminum wire is wound around an outer surface of the separation film 112. A diameter of the aluminum wire is about 0.1 millimeters. It may be understood that the positive electrode current collector may also be made of another metal wire of good electroconductivity, for example, a copper wire. In another implementation manner, the positive electrode current collector may also be formed by winding a foil around the outer surface of the separation film 112. Then, the outer surface of the positive electrode current collector is immersed into the positive electrode slurry. The positive electrode current collector is taken out and then baked. The positive electrode slurry forms a positive electrode active material layer.

Step 5: Add electrolytic solution 113 between the first positive electrode 114 and the first negative electrode 111 to obtain the energy storage unit 110.

Step S102: Prepare a thin-film-shaped electricity generation unit 120.

First, a transparent electrode of a second positive electrode 123 is provided. In this implementation manner, the transparent electrode is a polyethylene terephthalate film coated with an indium-tin oxide conductive layer. Then, an electrode modification layer is formed on a side, coated with the conductive layer, of the transparent electrode. In this implementation manner, the electrode modification layer is made by coating, with PEDOT:PSS, the side, coated with the conductive layer, of the transparent electrode. Next, a surface of the transparent electrode is coated to form a polymer active material layer 122. The polymer active material layer 122 may be P3HT and a soluble C60 derivative PCBM. A thickness of the polymer active material layer 122 is about 0.09 microns to 0.2 microns. Finally, a second negative electrode 121 is formed on the surface of the polymer active material layer 122, and the flake-shaped electricity generation unit 120 is formed. In this implementation manner, the second negative electrode 121 is formed by means of vapor deposition of metal silver. A thickness of the formed second negative electrode 121 is about 0.2 microns.

When the electricity generation unit 120 includes only one solar battery monomer, the electrode modification layer, the polymer active material layer 122, and the second negative electrode 121 are in a same shape as the transparent electrode, that is, are in a whole-flake shape. When the electricity generation unit 120 includes multiple solar battery monomers, a support is in a whole-flake structure, and the electrode modification layer, the polymer active material layer 122, and the second negative electrode 121 each are correspondingly split into multiple blocks, to form the multiple solar battery monomers. The solar battery monomers are connected in series using the conductive layer of the transparent electrode.

Step S103: Dispose the flake-shaped electricity generation unit 120 around a periphery of the energy storage unit 110 by means of winding to form a battery structure 100.

The flake-shaped electricity generation unit 120 is disposed around the energy storage unit 110. In this implementation manner, the second negative electrode 121 of the electricity generation unit 120 is in contact with the energy storage unit 110. The electricity generation unit 120 and the energy storage unit 110 are disposed concentrically.

Step S104: Connect a control circuit 200 between the electricity generation unit 120 and the energy storage unit 110.

The control circuit 200 includes a conductive line 210 and a control component 230. The control component 230 is connected to the conductive line 210. The control component 230 is configured to control whether the battery structure 100 works and its working status.

Figure 8:
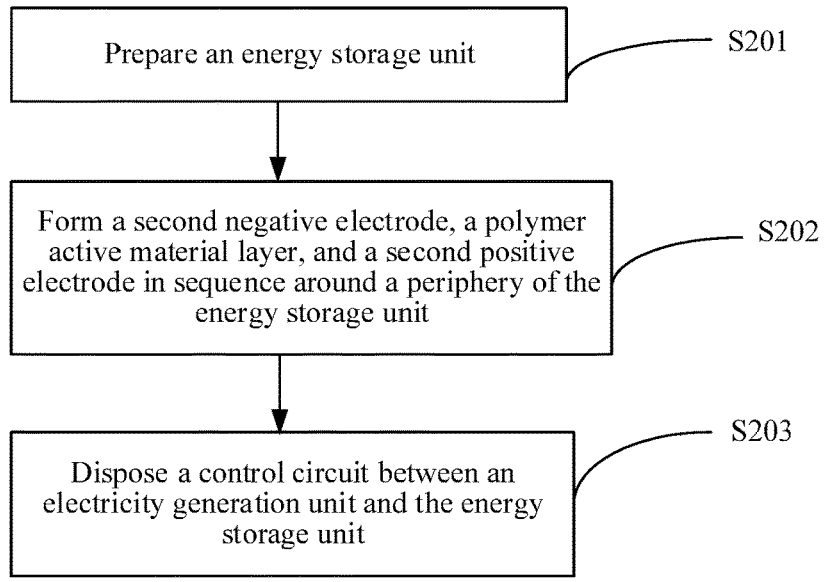
FIG. 8 is a flowchart of a second implementation manner of the method for making a battery apparatus according to the present disclosure.

Referring to FIG. 8, a second exemplary implementation manner of the second technical solution of the present disclosure provides a method for making a battery apparatus. A description is made using an example of making a battery apparatus 10. The method includes the following steps.

Step S201: Prepare an energy storage unit 110. In this step, a preparation method that is the same as the method in step S101 in the first exemplary implementation manner of the second technical solution of the present disclosure may be used, and details are not described herein again.

Step S202: Form a second negative electrode 121, a polymer active material layer 122, and a second positive electrode 123 in sequence around a periphery of the energy storage unit 110. This step may further include the following steps.

Step 1: Form the second negative electrode 121 around the energy storage unit 110. Furthermore, the second negative electrode 121 may be formed by wrapping a metal aluminum foil around the periphery of the energy storage unit 110. A thickness of the second negative electrode 121 is about 0.1 microns to 0.2 microns.

Step 2: Coat a periphery of the second negative electrode 121 with the polymer active material layer 122. The polymer active material layer 122 may be P3HT and a soluble fullerene derivative PCBM. A thickness of the polymer active material layer 122 is about 0.09 microns to 0.2 microns.

Step 3: Form the second positive electrode 123 around a periphery of the polymer active material layer 122. First, an electrode modification layer is formed by coating the periphery of the polymer active material layer 122 with PEDOT:PSS. Then, a transparent electrode is wrapped around a periphery of the electrode modification layer. The transparent electrode is a polyethylene terephthalate film coated with an indium-tin oxide conductive layer.

Step S203: Dispose a control circuit 200 between the electricity generation unit 120 and the energy storage unit 110. This step may be the same as step S104 in the previous implementation manner, and details are not described herein again.

Figure 9:
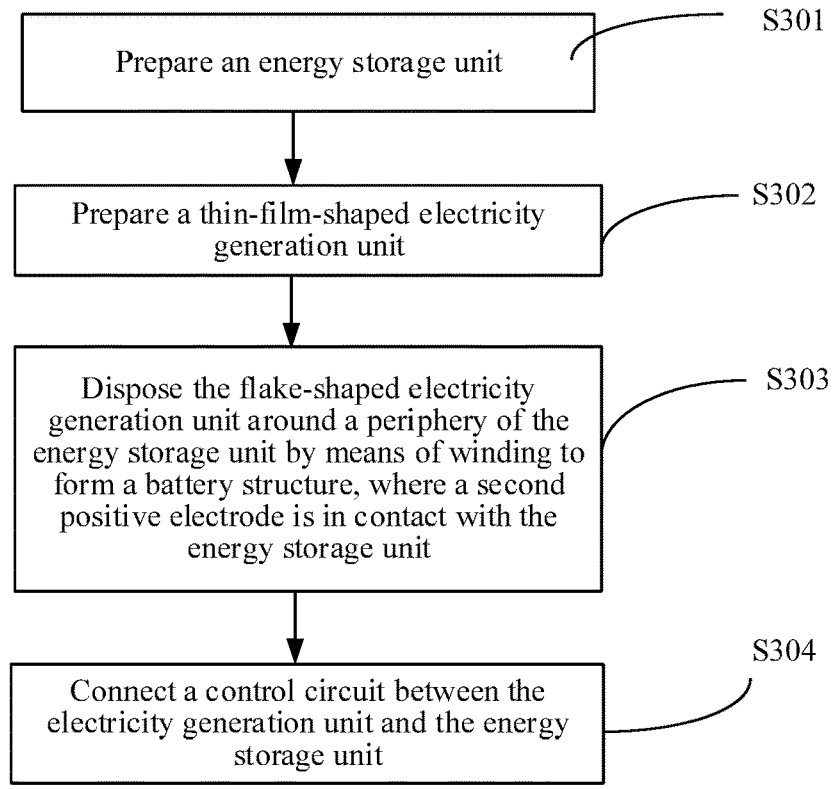
FIG. 9 is a flowchart of a third implementation manner of the method for making a battery apparatus according to the present disclosure.

Referring to FIG. 9, a third exemplary implementation manner of the second technical solution of the present disclosure provides a method for making a battery apparatus. This implementation manner is described using an example of making a battery apparatus 40. The method includes the following steps.

Step S301: Prepare an energy storage unit 410. In this implementation manner, the energy storage unit 410 is a lithium-ion battery. A specific making method may include the following.

In the first, prepare a positive electrode slurry and a negative electrode slurry. The negative electrode slurry may include a negative electrode active material, a bonding agent, a solvent, and the like. The negative electrode active material may be lithium titanate, graphite, silicon, tin, a tin alloy, or the like. The bonding agent may be CMC and bonding agent SBR latex. In this implementation manner, graphite powder, carboxyl methyl cellulose, and bonding agent styrene butadiene rubber latex are mixed according to a mass ratio of 95:2.5:2.5 and then added to deionized water to form the negative electrode slurry. The positive electrode slurry may include a positive electrode active material, a conductive agent, and a bonding agent. The positive electrode active material may be a lithium transition-metal oxide, a lithium phosphate, or an organic compound, and may be lithium cobaltate, lithium manganate, nickel cobalt lithium manganate, lithium titanate, lithium iron phosphate, lithium vanadium phosphate, lithium cobalt phosphate, lithium nickel phosphate, dithio oxamide, tetrathiafulvalene, ringed 1,2-dione, or the like. In this implementation manner, the positive electrode active material is lithium cobaltate, the conductive agent may be carbon black powder, and the bonding agent may be 1-chloro-1-fluoroethylene. After the lithium cobaltate, the carbon black powder, and the 1-chloro-1-fluoroethylene are mixed according to a mass ratio of 96:2:2, N-Methylpyrrolidone is added to form the oiliness positive electrode slurry.

In a second step, prepare a first positive electrode 411. A copper wire whose diameter is about 0.1 millimeters is used as a positive electrode current collector. The positive electrode current collector is immersed into the positive electrode slurry. After that, the positive electrode current collector is taken out and then baked. The dried positive electrode slurry forms a positive electrode active material layer on a surface of the positive electrode current collector.

In a third step, wrap a separation film 412 around the first positive electrode 411. The separation film 412 may be a microporous film made of polyethylene or polypropylene, or may be a porous film made of another material that can be applied to a lithium-ion battery separation film, such as polyvinylidene fluoride. The separation film 412 is wound and wrapped around an outer surface of the first positive electrode 411, and disposed concentrically with the first positive electrode 411.

In a fourth step, form a first negative electrode 414 around the separation film 412. First, a negative electrode current collector is formed on the separation film 412. In this implementation manner, the negative electrode current collector is made of a metal aluminum wire, where the metal aluminum wire is wound around an outer surface of the separation film 412. A diameter of the aluminum wire is about 0.1 millimeters. It may be understood that the negative electrode current collector may also be made of another metal wire of good electroconductivity, for example, a copper wire. In another implementation manner, the negative electrode current collector may also be formed by winding a foil around the outer surface of the separation film 412. Then, the outer surface of the negative electrode current collector is immersed into the negative electrode slurry. The negative electrode current collector is taken out and then baked. The negative electrode slurry forms a negative electrode active material layer.

In a fifth step, add electrolytic solution 413 between the first positive electrode 411 and the first negative electrode 414 to obtain the energy storage unit 410.

Step S302: Prepare a thin-film-shaped electricity generation unit 420.

First, a transparent electrode of a second negative electrode 423 is provided. In this implementation manner, the transparent electrode is a polyethylene terephthalate film coated with an indium-tin oxide conductive layer. Then, a negative electrode modification layer is formed on a side, coated with the conductive layer, of the transparent electrode. In this implementation manner, the electrode modification layer is made by coating, with PFN, the side of the transparent electrode that is coated with the conductive layer. Next, a surface of the transparent electrode is coated to form a polymer active material layer 422. The polymer active material layer 422 may be P3HT and a soluble fullerene derivative PCBM. A thickness of the polymer active material layer 422 is about 0.09 microns to 0.2 microns. Finally, a second positive electrode 421 is formed on the surface of the polymer active material layer 422, and the flake-shaped electricity generation unit 420 is formed. In this implementation manner, the second positive electrode 421 includes an electrode modification layer and a metal electrode. The electrode modification layer is molybdenum oxide film, and the metal electrode is formed by means of vapor deposition of metal gold or silver. A thickness of the formed second positive electrode 421 is about 0.2 microns.

When the electricity generation unit 420 includes only one solar battery monomer, the second negative electrode 423, the polymer active material layer 422, and the second positive electrode 421 are in a same shape, that is, in a whole-flake shape. When the electricity generation unit 420 includes multiple solar battery monomers, the transparent electrode is in a whole-flake structure, and the second negative electrode 423, the polymer active material layer 422, and the second positive electrode 421 each are correspondingly split into multiple blocks, to form the multiple solar battery monomers. The solar battery monomers are connected in series using the conductive layer of the transparent electrode.

Step S303: Dispose the flake-shaped electricity generation unit 420 around a periphery of the energy storage unit 410 by means of winding to form a battery structure 400.

The flake-shaped electricity generation unit 420 is disposed around the energy storage unit 410. In this implementation manner, the second positive electrode 421 of the electricity generation unit 420 is in contact with the energy storage unit 410. The electricity generation unit 420 and the energy storage unit 410 are disposed concentrically.

Step S304: Connect a control circuit 500 between the electricity generation unit 420 and the energy storage unit 410. This step may be the same as step S104 in the first implementation manner, and details are not described herein again.

Figure 10:
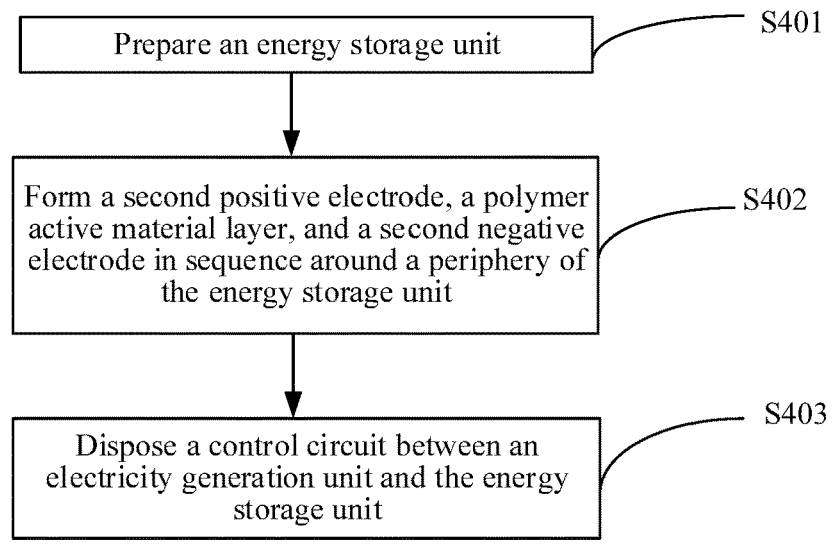
FIG. 10 is a flowchart of a fourth implementation manner of the method for making a battery apparatus according to the present disclosure.

Referring to FIG. 10, a fourth exemplary implementation manner of the second technical solution of the present disclosure provides a method for making a battery apparatus. The following provides a description using an example of making a battery apparatus 40. The method includes the following steps.

Step S401: Prepare an energy storage unit 410. In this step, a preparation method that is the same as the method in step S301 in the third exemplary implementation manner of the second technical solution of the present disclosure may be used, and details are not described herein again.

Step S402: Form a second positive electrode 421, a polymer active material layer 422, and a second negative electrode 423 in sequence around a periphery of the energy storage unit 410. This step may include the following steps.

Step 1: Form the second positive electrode 421 around the energy storage unit 410. the second positive electrode 421 may be formed by wrapping a metal gold or silver foil around the periphery of the energy storage unit 410 and performing vapor deposition of a molybdenum oxide layer. A thickness of the second positive electrode 421 is about 0.1 microns to 0.2 microns.

Step 2: Coat a periphery of the second positive electrode 421 with the polymer active material layer 422. The polymer active material layer 422 may be P3HT and a soluble C60 derivative PCBM. A thickness of the polymer active material layer 422 is about 0.09 microns to 0.2 microns.

Step 3: Form the second negative electrode 423 around a periphery of the polymer active material layer 422. First, a negative electrode modification layer is formed by coating the periphery of the polymer active material layer 422 with PFN. Then, a transparent electrode is wrapped around a periphery of the negative electrode modification layer. The transparent electrode is a polyethylene terephthalate film coated with an indium-tin oxide conductive layer.

Step S403: Dispose a control circuit 500 between the electricity generation unit 420 and the energy storage unit 410. This step may be the same as step S304 in the previous implementation manner, and details are not described herein again.

Figure 11:
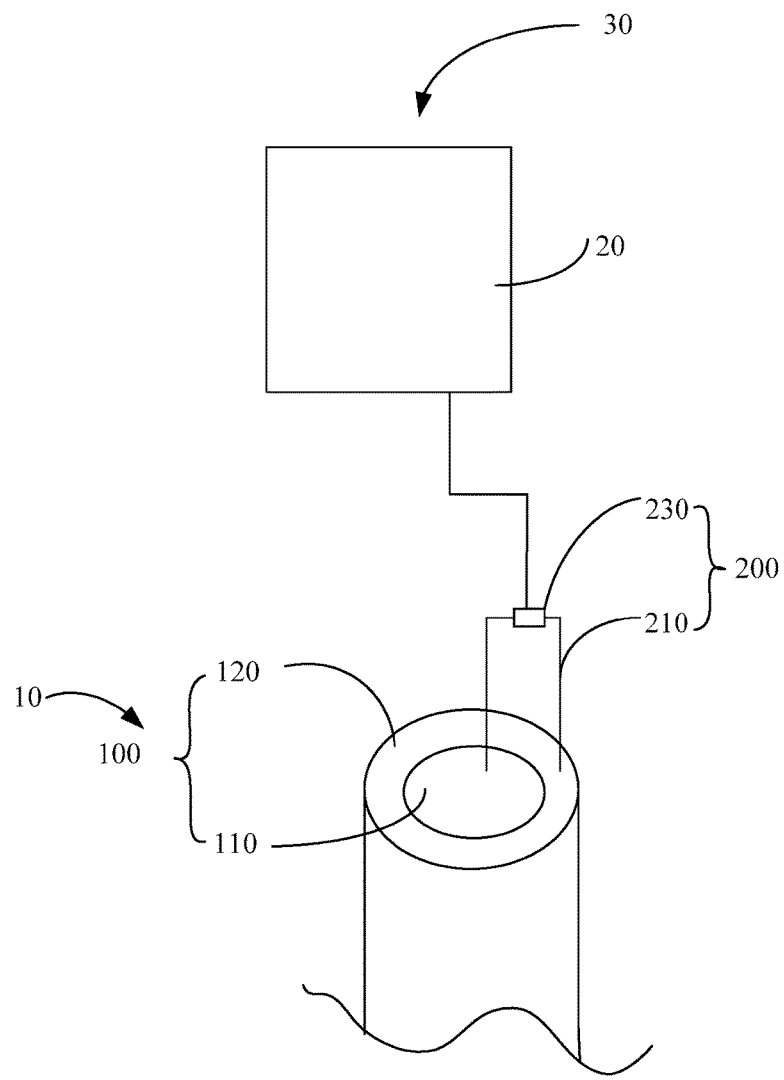
FIG. 11 is a schematic diagram of an electronic device according to the present disclosure.

Referring to FIG. 11, a first exemplary implementation manner of a third technical solution of the present disclosure provides an electronic device 30. The electronic device 30 includes an electronic device body 20 and a battery apparatus. The battery apparatus is the battery apparatus 10 provided in the first exemplary implementation manner of the first technical solution of the present disclosure, or may be the battery apparatus 40 provided in the second exemplary implementation manner of the first technical solution of the present disclosure. In this embodiment of the present disclosure, a description is made using the battery apparatus 10 as an example. The battery apparatus 10 may be configured to supply electricity to the electronic device body 20. The electronic device body 20 may be various types of electronic device parts, for example, a flexible electronic device or a wearable electronic device, such as an intelligent watch, intelligent glasses, and a flexible mobile phone. The electronic device body 20 is electrically connected to a control circuit 200 of the battery apparatus 10.

A control component 230 may include a detection module, a control module, a switch unit, and an inspection module. The detection module is configured to detect how much electric energy is stored in an energy storage unit 110. When the electronic device body 20 is not working, and when the detection module detects that the electric energy stored in the energy storage unit 110 reaches maximum electric energy stored in the energy storage unit 110, the control module may control the switch unit to interrupt an electric connection between an electricity generation unit 120 and the energy storage unit 110 such that electric energy generated by the electricity generation unit 120 is not stored into the energy storage unit 110. When the detection module detects that the electric energy stored in the energy storage unit 110 does not reach the maximum electric energy stored in the energy storage unit 110, the control module may control the switch unit to electrically connect the electricity generation unit 120 and the energy storage unit 110 such that the electric energy generated by the electricity generation unit 120 is stored into the energy storage unit 110.

When the detection module detects that electric energy is stored in the energy storage unit 110, the control module may control the switch unit to connect the energy storage unit 110 and the electronic device body 20, or connect the electricity generation unit 120 and the electronic device body 20, or connect the energy storage unit 110 and the electronic device body 20, and connect the electricity generation unit 120 and the electronic device body 20 in order to supply electricity to the electronic device body 20. When the detection module detects that no electric energy is stored in the energy storage unit 110, the control module may control the switch unit to connect the electricity generation unit 120 and the electronic device body 20 in order to supply electricity to the electronic device body 20. The control module may further control the electricity generation unit 120 to connect to the energy storage unit 110, and store electric energy into the energy storage unit 110.

The foregoing implementation manners are not intended to limit the protection scope of the technical solutions. Any modification, equivalent replacement, and improvement made without departing from the principle of the foregoing implementation manners shall fall within the protection scope of the technical solutions.

What is claimed is:

1. A battery apparatus comprising:
    a battery structure configured in a filamentous shape, the battery structure comprising:
        an energy storage unit disposed inside the battery structure; and
        an electricity generator disposed around the energy storage unit, the electricity generator comprising a solar battery; and
    a control circuit coupled to the battery structure, the control circuit configured to:
        operate in a first mode where the electricity generator is electrically disconnected from an electronic device and electrically connected to the energy storage unit such that electric energy generated by the electricity generator is transferred to and stored in the energy storage unit; and
        operate in a second mode where the electricity generator is electrically disconnected from the energy storage unit and electrically connected to the electronic device.

2. The battery apparatus according to claim 1, wherein both the electricity generator and the energy storage unit are disposed along an extension direction of an axis of the battery structure, wherein a cross-section, perpendicular to the axis of the battery structure, of the energy storage unit is a circle, wherein a cross-section, perpendicular to the axis of the battery structure, of the electricity generator is a ring, and wherein the electricity generator is disposed around the energy storage unit.

3. The battery apparatus according to claim 1, wherein the energy storage unit comprises a lithium-ion battery, wherein the energy storage unit comprises a first negative electrode, a separation film, an electrolyte, and a first positive electrode, wherein the first negative electrode comprises a negative electrode current collector and a negative electrode active material layer, and wherein the first positive electrode comprises a positive electrode current collector and a positive electrode active material layer.

4. The battery apparatus according to claim 3, wherein the negative electrode current collector is made of a copper wire, wherein a diameter of the negative electrode current collector is 0.05 millimeters to 0.2 millimeters, and wherein the positive electrode current collector is made of an aluminum wire whose diameter is 0.05 millimeters to 0.2 millimeters.

5. The battery apparatus according to claim 3, wherein the separation film surrounds the first negative electrode, wherein the first positive electrode surrounds the separation film, and wherein the electrolyte is padded between the first positive electrode and the first negative electrode.

6. The battery apparatus according to claim 5, wherein a cross-section, perpendicular to an extension direction of the battery structure, of the energy storage unit is a circle, wherein a cross-section, perpendicular to the extension direction of the battery structure, of the first negative electrode is a circle, and wherein cross-sections, perpendicular to the extension direction of the battery structure, of the separation film and the first positive electrode are rings.

7. The battery apparatus according to claim 3, wherein the separation film surrounds the first positive electrode, wherein the first negative electrode surrounds the separation film, and wherein the electrolyte is padded between the first positive electrode and the first negative electrode.

8. The battery apparatus according to claim 7, wherein a cross-section, perpendicular to an extension direction of the battery structure, of the energy storage unit is a circle, wherein a cross-section, perpendicular to the extension direction of the battery structure, of the first positive electrode is a circle, and wherein cross-sections, perpendicular to the extension direction of the battery structure, of the separation film and the first negative electrode are rings.

9. The battery apparatus according to claim 3, wherein the negative electrode active material layer comprises a negative electrode active material, wherein the negative electrode active material is lithium titanate, graphite, silicon, tin, or a tin alloy, wherein the positive electrode active material layer comprises a positive electrode active material, and wherein the positive electrode active material is a lithium transition-metal oxide, a lithium phosphate, or an organic compound.

10. The battery apparatus according to claim 1, wherein the electricity generator comprises a polymer solar battery, wherein the electricity generator comprises a second negative electrode, a polymer active material layer, and a second positive electrode in a sequence from inside to outside, wherein the second positive electrode comprises an electrode modification layer and a transparent electrode, and wherein the transparent electrode is a polyethylene terephthalate film coated with an indium-tin oxide conductive layer.

11. The battery apparatus according to claim 1, wherein the electricity generator comprises a polymer solar battery, wherein the electricity generator comprises a second positive electrode, a polymer active material layer, and a second negative electrode in a sequence from inside to outside, wherein the second negative electrode comprises an electrode modification layer and a transparent electrode, and wherein the transparent electrode is a polyethylene terephthalate film coated with an indium-tin oxide conductive layer.

12. The battery apparatus according to claim 10, wherein the polymer active material layer comprises a donor material and a receptor material, wherein the donor material is a first polymer containing thiophene, a second polymer containing benzodithiophene, or a third polymer containing thienothiophene, and wherein the receptor material is a fullerene derivative.

13. The battery apparatus according to claim 10, wherein the electricity generator comprises multiple solar battery monomers, wherein the electrode modification layer, the polymer active material layer, and the second negative electrode are split into multiple blocks along an extension direction of the battery structure, wherein each block forms one solar battery monomer, and wherein the solar battery monomers are connected in series using the indium-tin oxide conductive layer of the transparent electrode.

14. The battery apparatus according to claim 11, wherein the electricity generator comprises multiple solar battery monomers, wherein the electrode modification layer, the polymer active material layer, and the second positive electrode are split into multiple blocks along an extension direction of the battery structure, wherein each block correspondingly forms one solar battery monomer, and wherein the solar battery monomers are connected in series using the indium-tin oxide conductive layer of the transparent electrode.

15. The battery apparatus according to claim 1, wherein a cross-section, perpendicular to an extension direction of the battery structure, of the battery structure is a circle, a triangle, or a polygon.

16. The battery apparatus according to claim 1, wherein a cross-section, perpendicular to an extension direction of the battery structure, of the battery structure is a circle, and wherein a diameter of the cross-section is 0.3 millimeters to 0.8 millimeters.

17. An electronic device, comprising:
a battery apparatus coupled to the electronic device, the battery apparatus comprising:
a battery structure configured in a filamentous shape, the battery structure comprising:
an energy storage unit disposed inside the battery structure; and
an electricity generator coupled to the energy storage unit and disposed around the energy storage unit, the electricity generator comprising a solar battery; and
a control circuit configured to:
operate in a first mode where the electricity generator is electrically disconnected from the electronic device and electrically connected to the energy storage unit such that electric energy generated by the electricity generator is transferred to and stored in the energy storage unit; and
operate in a second mode where the electricity generator is electrically disconnected from the energy storage unit and electrically connected to the electronic device.

18. The electronic device according to claim 17, wherein both the electricity generator and the energy storage unit are disposed along an extension direction of an axis of the battery structure, wherein a cross-section, perpendicular to the axis of the battery structure, of the energy storage unit is a circle, wherein a cross-section, perpendicular to the axis of the battery structure, of the electricity generator is a ring, and wherein the electricity generator is disposed around the energy storage unit.

19. The electronic device according to claim 17, wherein the energy storage unit comprises a lithium-ion battery, wherein the energy storage unit comprises a first negative electrode, a separation film, an electrolyte, and a first positive electrode, wherein the first negative electrode comprises a negative electrode current collector and a negative electrode active material layer, and wherein the first positive electrode comprises a positive electrode current collector and a positive electrode active material layer.

20. The electronic device according to claim 17, wherein the electricity generator comprises a polymer solar battery, wherein the electricity generator comprises a second negative electrode, a polymer active material layer, and a second positive electrode in a sequence from inside to outside, wherein the second positive electrode comprises an electrode modification layer and a transparent electrode, and wherein the transparent electrode is a polyethylene terephthalate film coated with an indium-tin oxide conductive layer.

* * * * *